(12) United States Patent
Toba et al.

(10) Patent No.: US 12,376,235 B2
(45) Date of Patent: Jul. 29, 2025

(54) LAYERED PLATE AND WIRING BASE BOARD PRODUCTION METHOD

(71) Applicant: Resonac Corporation, Tokyo (JP)

(72) Inventors: Masaya Toba, Tokyo (JP); Kazuyuki Mitsukura, Tokyo (JP); Masaki Yamaguchi, Tokyo (JP)

(*) Notice: Subject to any disclaimer, the term of this patent is extended or adjusted under 35 U.S.C. 154(b) by 219 days.

(21) Appl. No.: 18/258,556

(22) PCT Filed: Dec. 25, 2020

(86) PCT No.: PCT/JP2020/048895
§ 371 (c)(1),
(2) Date: Jun. 21, 2023

(87) PCT Pub. No.: WO2022/137550
PCT Pub. Date: Jun. 30, 2022

(65) Prior Publication Data
US 2024/0049395 A1  Feb. 8, 2024

(51) Int. Cl.
*H05K 1/02* (2006.01)
*H05K 1/18* (2006.01)
*H05K 3/02* (2006.01)

(52) U.S. Cl.
CPC ............ *H05K 1/181* (2013.01); *H05K 3/022* (2013.01); *H05K 2201/0209* (2013.01); *H05K 2201/0358* (2013.01); *H05K 2201/10553* (2013.01); *H05K 2203/1377* (2013.01)

(58) Field of Classification Search
CPC .. H05K 2201/0358; H05K 1/024; H05K 3/38; H05K 2201/0338
See application file for complete search history.

(56) References Cited

U.S. PATENT DOCUMENTS

| | | | |
|---|---|---|---|
| 2016/0075871 A1* | 3/2016 | Morita | H01L 24/94 525/481 |
| 2016/0083509 A1* | 3/2016 | Im | C08G 69/44 528/302 |
| 2018/0275031 A1 | 9/2018 | Kashihara et al. | |

FOREIGN PATENT DOCUMENTS

| | | |
|---|---|---|
| CN | 1578601 | 2/2005 |
| CN | 101472407 | 7/2009 |
| CN | 103039131 | 4/2013 |
| CN | 111465638 | 7/2020 |
| JP | H10-335785 | 12/1998 |
| JP | 2000-133915 | 5/2000 |
| JP | 2000-136995 | 5/2000 |
| JP | 2001-053444 | 2/2001 |
| JP | 2010-018842 | 1/2010 |
| JP | 2012-169600 | 9/2012 |

(Continued)

OTHER PUBLICATIONS

International Search Report dated Mar. 9, 2021 for PCT/JP2020/048895.

(Continued)

*Primary Examiner* — Sherman Ng
(74) *Attorney, Agent, or Firm* — SOEI PATENT & LAW FIRM

(57) ABSTRACT

A layered plate including a copper layer having a thickness of 5 μm or less, and a resin layer provided on a surface of the copper layer, in which a water absorption rate of the resin layer is 1% or less after being left in an environment of 130° C. in temperature and 85% in relative humidity for 200 hours.

12 Claims, 5 Drawing Sheets

(56) References Cited

FOREIGN PATENT DOCUMENTS

| | | |
|---|---|---|
| JP | 2013-182959 | 9/2013 |
| JP | 2016-058581 | 4/2016 |
| JP | 2017-061609 | 3/2017 |
| JP | 2017-101152 | 6/2017 |
| JP | 2018-160636 | 10/2018 |
| JP | 2019-066511 | 4/2019 |
| JP | 2019-067980 | 4/2019 |
| JP | 2019-218602 | 12/2019 |
| JP | 2020-045501 | 3/2020 |
| WO | 2015/141719 | 9/2015 |
| WO | 2019/244541 | 12/2019 |

OTHER PUBLICATIONS

International Preliminary Report on Patentability with Written Opinion dated Jul. 6, 2023 or PCT/JP2020/048895.

* cited by examiner (a)

(b)

(c)

(a)

(b)

(c)

LAYERED PLATE AND WIRING BASE BOARD PRODUCTION METHOD

CROSS-REFERENCE TO RELATED APPLICATIONS

This application is a 35 U.S.C. § 371 national phase application of PCT/JP2020/048895, filed on Dec. 25, 2020.

TECHNICAL FIELD

The present disclosure relates to a layered plate including a copper layer having a thickness of 5 μm or less, and a method of manufacturing a circuit board using the layered plate.

BACKGROUND ART

In recent, technological innovations such as Internet of Things (IoT) and AI of electronics-related products are in progress. A $5^{th}$ generation (5G) mobile communication system which enables high-speed, large-capacity, and low-delay multi-connection is essential for spreading of the technologies. In a field of 5G, it is necessary to use a frequency band higher than that of electric signals which have been used in a $4^{th}$ generation (4G) mobile communication system. However, high-frequency electric signals have a characteristic of being greatly attenuated (transmission loss), and thus a circuit board for high frequencies is required to suppress the transmission loss to be low.

Patent Literature 1 discloses an invention relating to a roughened copper foil, a copper-clad laminate, and a printed circuit board. According to Patent Literature 1, it is described that the roughed copper foil described in Patent Literature 1 can significantly improve heat-resistant peeling strength against a thermoplastic resin with a low dielectric constant.

CITATION LIST

Patent Literature

Patent Literature 1: Japanese Unexamined Patent Publication No. 2019-218602

SUMMARY OF INVENTION

Technical Problem

By the way, according to an examination performed by the present inventors, as copper foil for forming fine wiring becomes thinner, oxidation of a copper foil surface tends to cause deterioration in reliability of the circuit board. The present disclosure provides a layered plate useful for improving the reliability of the circuit board, and a method of manufacturing a circuit board using the layered plate.

Solution to Problem

An aspect of the present disclosure relates to a layered plate. The layered plate includes a copper layer having a thickness of 5 μm or less, and a resin layer provided on a surface of the copper layer. A water absorption rate of the resin layer is 1% or less after being left in an environment of 130° C. in temperature and 85% in relative humidity for 200 hours. Hereinafter, "after being left in an environment of 130° C. in temperature and 85% in relative humidity for 200 hours" is referred to as "after highly accelerated life test" in some cases. Note that, the "highly accelerated life test" is referred to as "highly accelerated stress test (HAST)" in some cases.

When the water absorption rate of the resin layer after the highly accelerated life test is 1% or less, oxidation (generation of rust) of the copper layer due to moisture contained in the resin layer can be suppressed. Fine wiring of the circuit board is formed through a process of processing the copper layer. Since generation of rust in the copper layer is suppressed, the fine wiring can maintain a performance to be exhibited for a sufficiently long period of time.

From the viewpoint of further improving reliability of the circuit board including the fine wiring, it is preferable that 90° peel strength of an interface between the copper layer and the resin layer satisfy the following conditions.

- 90° peel strength of an interface between the copper layer and the resin layer is 0.4 N/mm or more.
- 90° peel strength of the interface between the copper layer and the resin layer is 0.25 N/mm or more after the highly accelerated life test.

Variation rate of the 90° peel strength is −30% to 0% before and after the highly accelerated life test.

The layered plate may further include a rust preventive layer between the resin layer and the copper layer. In a process of manufacturing the circuit board, the rust preventive layer suppresses oxidation of the copper layer and the fine wiring for lied by processing the copper layer.

An aspect of the present disclosure relates to a method of manufacturing a circuit board. The manufacturing method includes the following processes.

A process of preparing a layered plate which includes a copper layer having a thickness of 5 μm or less, a resin layer, and a support substrate in this order, and in which a water absorption rate of the resin layer is 1% or less after being left in an environment of 130° C. in temperature and 85% in relative humidity for 200 hours.

A process of forming a seed layer on a surface of the copper layer by electroless copper plating.

A process of forming a resist pattern including a groove reaching a surface of the seed layer on the surface of the seed layer.

A process of filling the groove with a conductive material containing copper by electrolysis copper plating.

The method of manufacturing the circuit board according to the present disclosure may be a method of manufacturing a multi-layer circuit board including a via-hole and a conductive material with which fills the via hole. The method of manufacturing the circuit board includes the following processes.

A process of preparing a layered plate which includes a copper layer having a thickness of 5 μm or less, a resin layer, and a support substrate in this order, and in which a water absorption rate of the resin layer after being left in an environment of 130° C. in temperature and 85% in relative humidity for 200 hours is 1% or less.

A process of forming a first opening reaching a surface of the support substrate through the copper layer and the resin layer.

A process of forming a seed layer on a surface of the copper layer and a side surface of the first opening by electroless copper plating.

A processing of forming a resist pattern including a second opening communicating with the first opening on a surface of the seed layer.

A process of filling the first opening and the second opening with a conductive material containing copper by electrolysis copper plating.

Advantageous Effects of Invention

According to the present disclosure, there are provided a layered plate that is also useful for manufacturing a circuit board with excellent reliability, and a method of manufacturing a circuit board using the layered plate.

DESCRIPTION OF EMBODIMENTS

Figure 1:
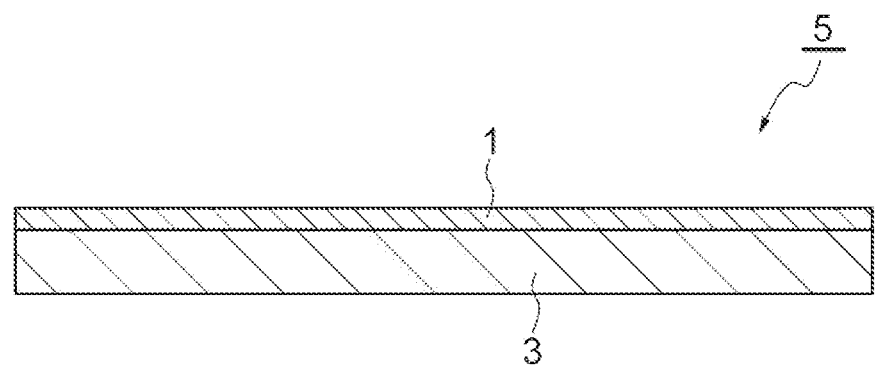
FIG. 1 is a cross-sectional view schematically illustrating an embodiment of a layered plate according to the present disclosure.
(a) to (c) in FIG. 2. are cross-sectional views schematically illustrating a process of manufacturing a circuit board.
(a) to (c) in FIG. 3 are cross-sectional views schematically illustrating a process of manufacturing the circuit board.
(a) to (c) in FIG. 4 are cross-sectional views schematically illustrating a process of manufacturing the circuit board.

Hereinafter, embodiments of the present disclosure will be described in detail with reference to the accompanying drawings. In the following description, the same reference numeral will be given to the same or equivalent portion, and redundant description will be omitted. In addition, positional relationships such as up, down, right, and left are based on positional relationship shown in the drawings unless otherwise stated. Dimension ratios in the drawings are not limited to illustrated ratios.

In a case where terminologies such as "left", "right", "front surface", "rear surface", "up", "down", "upward", and "downward" are used in description and the appended claims in this specification, these are used for explanation, and are not used for permanent relative positions. In addition, a terminology of "layer" also includes a structure having a shape that is formed at a part in addition to a structure having a shape formed on all surfaces when being observed by a plan view. "A or B" may include any one of A and B, and may include both of A and B.

A terminology of "process" in this specification includes not only an independent process but also a process of which an expected operation is achieved even in a case where the process cannot be clearly distinguished from other processes. In addition, a numerical range expressed by "to" represents a range including numerical values described before and after "to" as a minimum value and a maximum value respectively.

With regard to the content of each component of a composition in this specification, in a case where a plurality of materials corresponding to each component exist in the composition, the content represents a total amount of the plurality of materials existing in the composition unless otherwise stated. In addition, an exemplified material may be used alone or in combination of two or more kinds unless otherwise stated. In addition, in a numerical range that is described step by step in this specification, an upper limit value or a lower limit value of a numerical range in any step may be substituted with an upper limit value or a lower limit value of a numerical range of another step. In addition, in a numerical range described in this specification, an upper limit value or a lower limit value of the numerical range may be substituted with a value shown in Examples.

[Layered Plate]

FIG. 1 is a cross-sectional view schematically illustrating a layered plate according to this embodiment. A layered plate 5 illustrated in the drawing includes a copper layer 1 having a thickness of 5 µm or less, and a resin layer 3 provided on a surface of the copper layer 1. The layered plate 10 is used to manufacture a circuit board for high frequencies of 1 to 50 GHz (more preferably, 10 to 50 GHz).

(Copper Layer)

The thickness of the copper layer 1 is 5 µm or less as described above, but may be 3 µm or less. When the thickness of the copper layer 1 is 5 µm or less, etching time for forming fine wiring after forming a conductive portion 9a is shortened, and the amount of etching can also be suppressed (refer to (c) in FIG. 3 and (a) in FIG. 4). As the copper layer 1 having a thickness of 5 µm or less, for example, copper foil can be used. A lower limit of the thickness of the copper foil is, for example, 1.5 µm from the viewpoint of a handling property. The copper foil having the thickness is commercially available in a state of stacked on copper foil called a carrier through a peeling-off layer. For example, micro thin (trademark) (manufactured by MITSUI MINING & SMELTING CO., LTD) includes a copper foil having a thickness of 1.5 to 5 µm, a peeling-off layer, and a copper foil (carrier) having a thickness of 18 µm.

The copper layer 1 may be formed by electroless plating. A thickness range of the copper layer 1 that is easy to be manufactured by the electroless plating is, for example, 50 to 500 nm. The copper layer 1 can be formed by the electroless plating through the following processes. First, a surface on which the copper layer 1 is to be formed is cleaned by using an acidic cleaner (for example, MCD (product name) manufactured by C.Uyemura & Co., Ltd.). Next, the surface is acid washed with an aqueous sulfuric acid solution at 25° C. The surface is immersed in a predip solution (for example, MDP (product name) manufactured by C.Uyemura & Co., Ltd.). Next, the surface is immersed in an activator solution (product name: MAT, manufactured by C.Uyemura & Co., Ltd.) to cause a palladium catalyst to adhere to the surface. Next, the palladium catalyst is reduced by using a reducer solution (for example, MAB (product name) manufactured by C.Uyemura & Co., Ltd.). Next, the palladium catalyst is activated by using an accelerator solution (for example, MEL (product name) manufactured by C.Uyemura & Co., Ltd.). Then, copper is caused to precipitate to the surface by using an electroless plating solution (for example, PEAV2 (product name) manufactured by C.Uyemura & Co., Ltd.).

The copper layer may be formed on the surface of the electroless copper plated layer by electrolysis plating by using the electroless copper plated layer formed as described above as a seed layer. For example, the copper layer 1 having a thickness of 1 to 5 µm may be formed in combination of the electroless plating and the electrolysis plating.

(Resin Layer)

In this embodiment, the resin layer 3 is provided in a state of being in contact with the surface of the copper layer 1. The water absorption rate of the resin layer 3 is 1% or less after a highly accelerated life test (after being left in an environment of 130° C. in temperature and 85% in relative humidity for 200 hours, hereinafter, referred to as "after HAST"). When the water absorption rate of the resin layer 3 after HAST is 1% or less, oxidation (generation of rust) of the copper layer 1 due to moisture included in the resin layer 3 can be suppressed. From the viewpoint of further suppressing oxidation of the copper layer 1, the water absorption rate of the resin layer 3 after HAST is preferably 0.5% or less, and more preferably 0.2% or less. Note that, a lower limit value of the water absorption rate is, for example, 0.2%.

With regard to a material that constitutes the resin layer 3, from the viewpoint of further improving reliability of a circuit board including fine wiring, 90° peel strength of an interface between the copper layer 1 and the resin layer 3 preferably satisfies the following conditions. The 90° peel strength is measured with respect to a sample prepared by cutting the layered plate 10 in a predetermined size.

90° peel strength of an interface between the copper layer 1 and the resin layer 3 is 0.4 N/mm or more (for example, 0.5 to 1.2 N/mm).

90° peel strength of the interface between the copper layer 1 and the resin layer 3 after HAST is 0.25 N/mm or more (for example, 0.4 to 1.2 N/mm).

A variation rate of the 90° peel strength before and after HAST is −30% to 0% (more preferably, −10% to 0%).

Adhesion (90° peel strength) of the interface between the copper layer 1 and the resin layer 3 can be improved by roughening the surface (on a side in contact with the resin layer 3) of the copper layer 1 to a certain extent that does not deteriorate, for example, high-frequency transmission performance. For this treatment, for example, an organic acid-based micro-etching agent (manufactured by MEC Co., Ltd.) can be used. Instead of the roughening treatment with chemicals, the surface of the copper layer 1 (on a side in contact with the resin layer 3) may be appropriately roughened by irradiation with plasma using, for example, oxygen, argon, or nitrogen as gas species, or irradiation with ultraviolet rays.

From the viewpoint of suppressing a transmission loss of a circuit board for a high frequency, the resin layer 3 preferably satisfies the following conditions.

A relative dielectric constant of the resin layer 3 is 4.5 or less (more preferably, 3.5 to 2.5) at 10 GHz.

A dielectric loss tangent of the resin layer 3 is 0.05 or less (more preferably, 0.04 to 0.03) at 10 GHz.

The resin layer 3 is constituted mainly by a resin composition, and may be constituted, for example, by the resin composition and glass cloth impregnated with the resin composition. For example, the resin composition may be a thermosetting property, a thermoplastic property, or a photocurable property. From the viewpoint of reliability of the circuit board, the resin composition preferably contains a thermosetting resin composition. From the viewpoint of heat resistance, the resin layer 3 may contain a heat resistant resin (for example, an epoxy resin).

In a case where the resin layer 3 is the thermosetting resin composition, the resin layer 3 preferably contains a silica filler. The content of the silica filler is, for example, 65% by mass or less based on a total mass of the resin contained in the thermosetting resin composition, and may be 65% by mass to 53% by mass. The content of the silica filler is, for example, 85% by volume or less based on a total volume of a solid content included in the thermosetting resin composition, and may be 60% by volume to 80% by volume. When the content of the silica filler is 80% by volume or less, a side wall of a via after laser via processing becomes smoother in comparison to a case where the content exceeds 80% by volume, and via connection reliability tends to be improved.

On the other hand, when the content of the silica filler is 60% by volume or more, warpage of the circuit board tends to be further suppressed in comparison to a case where the content is less than 60% by volume.

As the resin layer 3, a commercially available prepreg may be used. According to evaluation performed by the present inventors, for example, any of prepregs E-705G, E-770G, HS-200, and LW-910G manufactured by Showa Denko Materials Co., Ltd. can be used as the resin layer 3. The prepregs are in a semi-cured state (B stage), and enter a cured state (C stage) through a heat treatment.

[Method of Manufacturing Layered Plate]

For example, the layered plate 5 is manufactured through the following processes.

A process of preparing the copper layer 1 stacked on a carrier through a peeling-off layer.

A process of preparing the resin layer 3 (for example, the prepreg).

A process of releasing the carrier after sticking the copper layer 1 to the surface of the resin layer 3.

[Method of Manufacturing Circuit Board]

Figure 4:
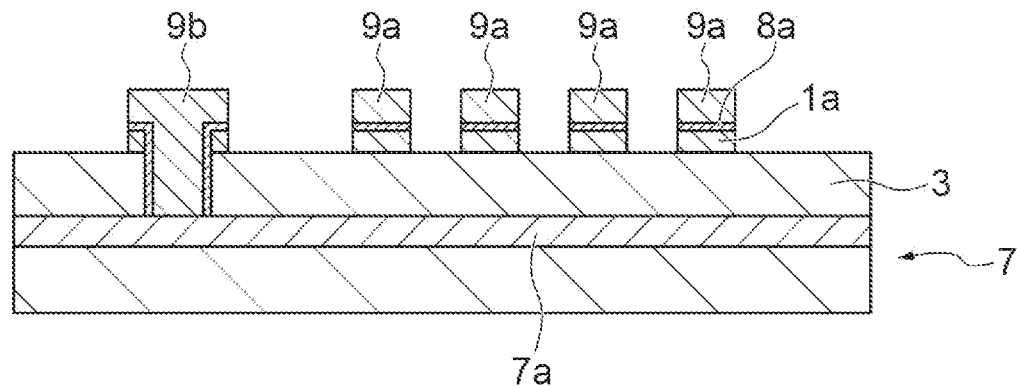
Figure 4:
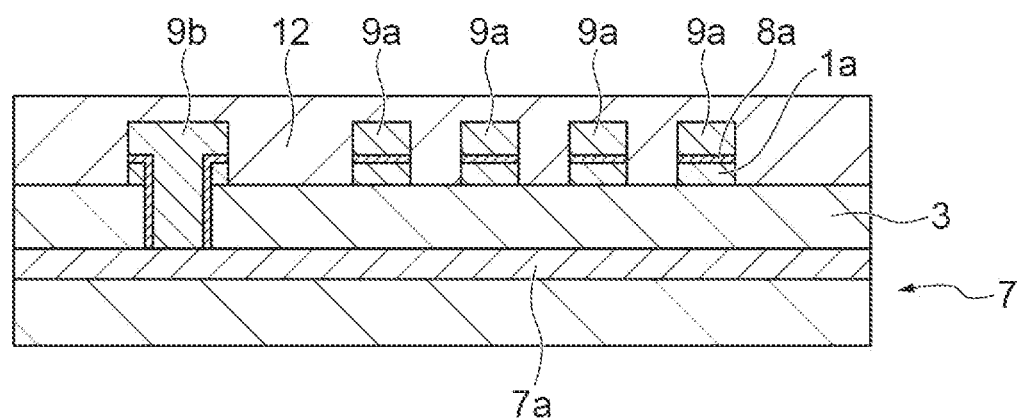
Figure 4:
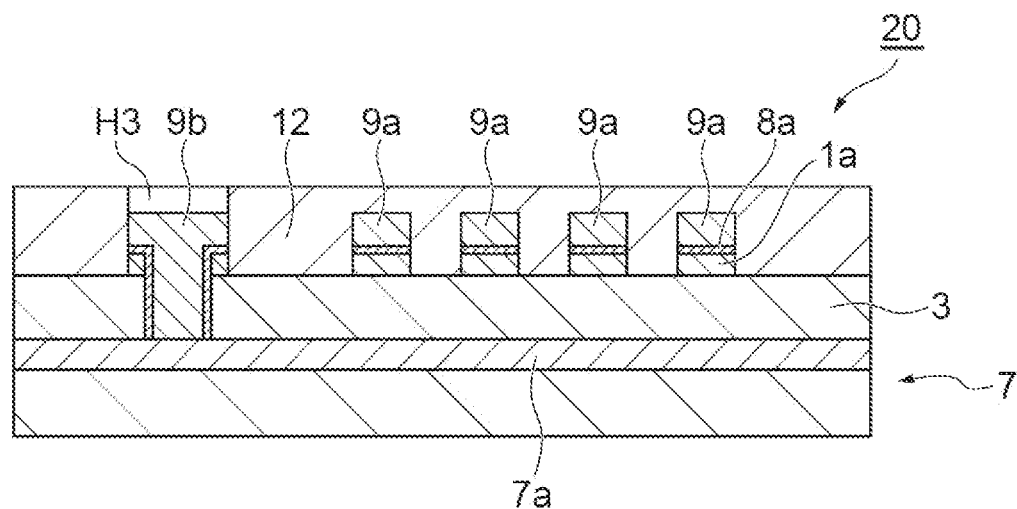

A method of manufacturing a circuit board according to this embodiment will be described with reference to the accompanying drawings. A circuit board 20 illustrated in (c) in FIG. 4 is manufactured through the following processes.

Figure 2:
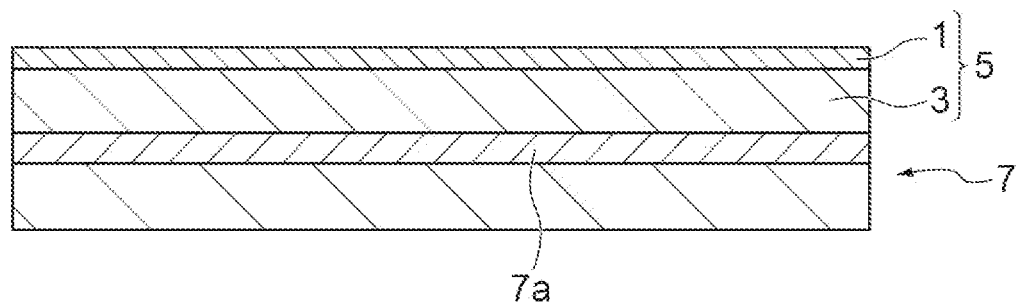
Figure 2:
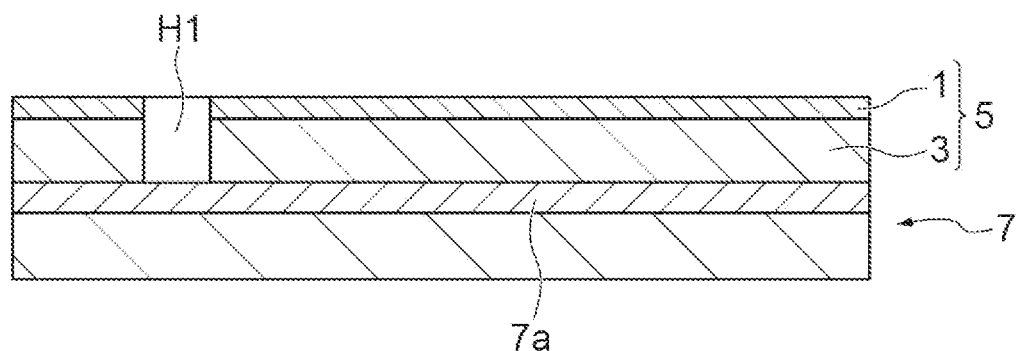
Figure 2:
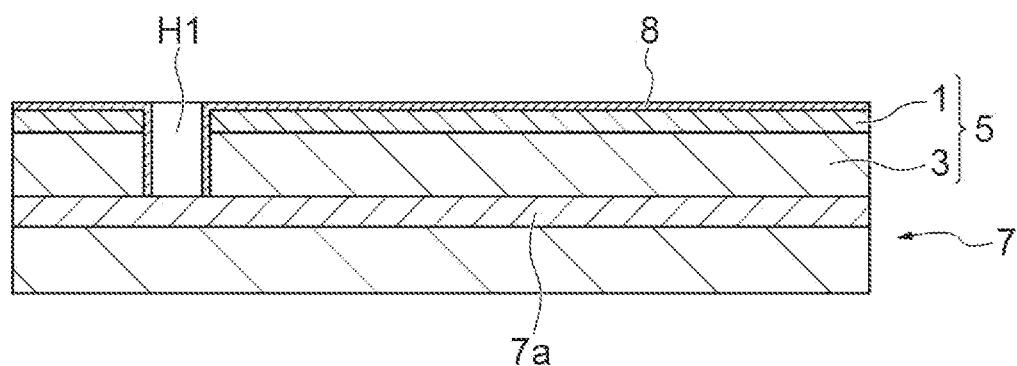

(A) A process of preparing a layered plate 10 including the copper layer 1, the resin layer 3, and a support substrate 7 in this order (refer to (a) in FIG. 2). The layered plate 10 may be prepared by preparing the layered plate 5 including the copper layer 1 and the resin layer 3 in advance and by stacking the support substrate 7 on the layered plate 5, or may be prepared by preparing a layered plate including the resin layer 3 and the support substrate 7 in advance, and by stacking the copper layer 1 on the layered plate. As the support substrate 7, for example, a copper-clad laminate can be used, and a copper layer 7a is provided on a surface of the support substrate 7.

(B) A process of forming an opening H1 (a first opening) reaching the surface (copper layer 7a) of the support substrate 7 through the copper layer 1 and the resin layer 3 (refer to (b) in FIG. 2). For example, the opening H1 can be formed by irradiation with a laser. In a case where a residue is recognized in the opening H1, a desmear treatment may be performed after the process (B).

(C) A process of forming a seed layer 8 on the surface of the copper layer 1 and a side surface of the opening H1 by electroless copper plating (refer to (c) in FIG. 2). The seed layer 8 is a power supply layer for carrying out electrolysis plating in a following process (E).

Figure 3:
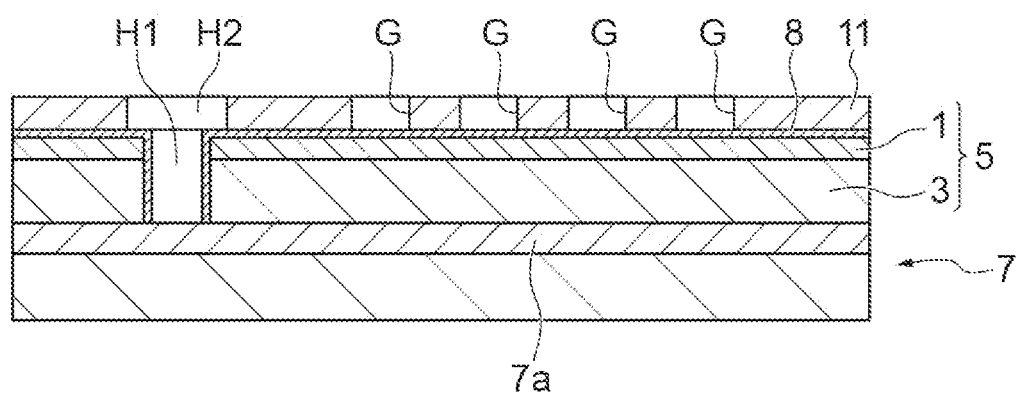
Figure 3:
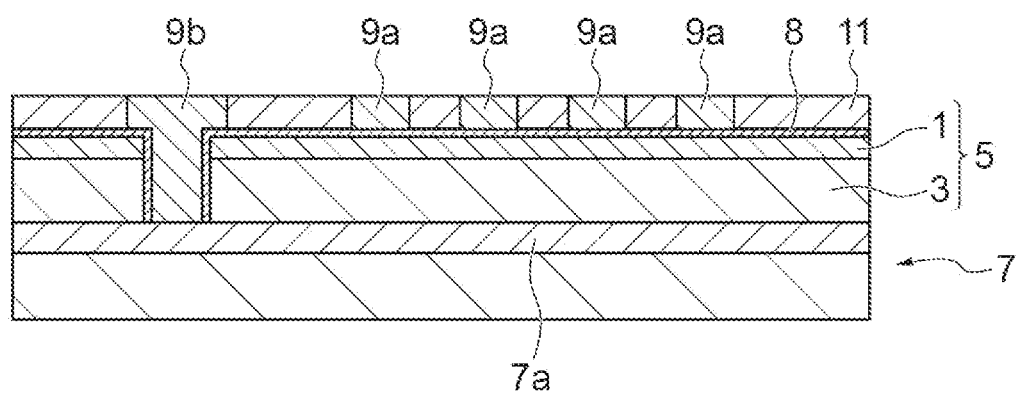
Figure 3:
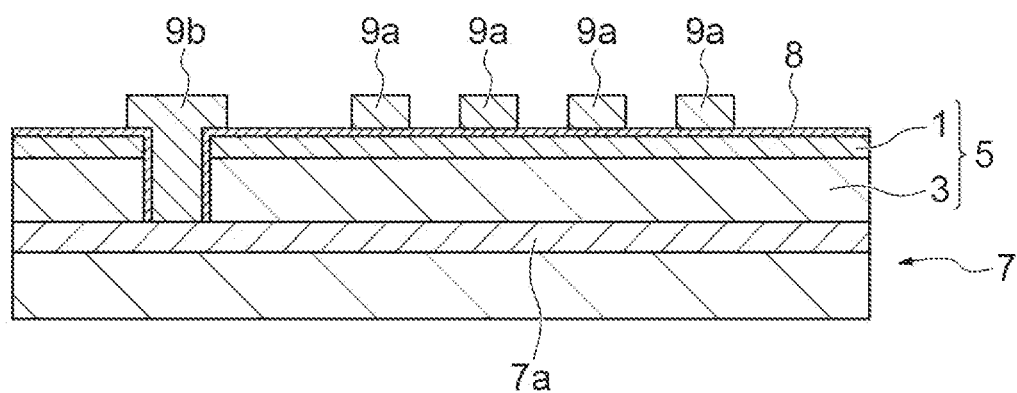

(D) A process of forming a resist pattern 11 including an opening H2 (second opening) communicating with the opening H1 and a plurality of grooves G reaching a surface of the seed layer 8 on the surface of the seed layer 8 (refer to (a) in FIG. 3).

(E) A process of filling the opening H2 and the grooves G with a conductive material containing copper by electrolysis copper plating (refer to (b) in FIG. 3).

When the grooves G are filled with the conductive material containing copper by the electrolysis copper plating, a conductive portion 9a constituting a part of fine wiring is formed. When the openings H1 and H2 are filled with the conductive material containing copper by electrolytic copper plating, a conductive portion 9b (a part of interlayer conductive portion) is formed.

(F) A process of peeling off the resist pattern 11 (refer to (c) in FIG. 3).

(G) A process of removing the seed layer 8 exposed due to peeling-off of the resist pattern 11, and removing the copper layer 1 exposed due to removal of the seed layer 8 (refer to (a) in FIG. 4).

When each of unnecessary portions of the seed layer 8 and the copper layer 1 are removed, for example, by etching, fine wiring is constituted by the conductive portion 9a, a remaining portion 8a of the seed layer 8, and a remaining portion 1a of the copper layer 1.

(H) A process of forming a resin layer 12 to cover a surface of the copper layer 7a, the fine wiring, and the conductive portion 9b (refer to (b) in FIG. 4).

(I) A process of forming an opening H3 (third opening) reaching the conductive portion 9b on the resin layer 12 (refer to (c) in FIG. 4).

Via holes are formed by the openings H1, H2, and H3. The via holes are filled with a conductive material, and surface finish processing and the like are performed to complete the circuit board.

Figure 5:
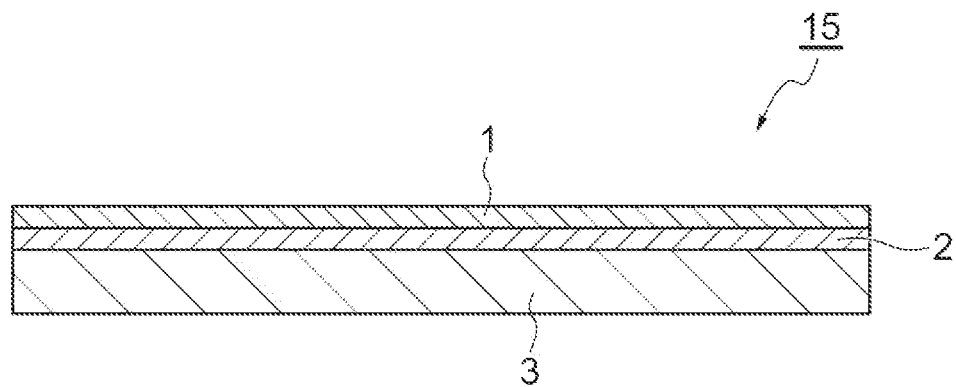
FIG. 5 is a cross-sectional view schematically illustrating another embodiment of the layered plate according to the present disclosure.

Hereinbefore, the embodiment of the present disclosure has been described in detail, but the present invention is not limited to the embodiment. For example, in the above-described embodiment, as the layered plate 5, an aspect in which the copper layer 1 and the resin layer 3 are in direct contact with each other has been exemplified, but a rust preventive layer may be formed between the layers. In a layered plate illustrated in FIG. 5, a rust preventive layer 2 is formed at an interface between the copper layer 1 and the resin layer 3. For example, the rust preventive layer 2 can be formed by using a triazole compound or a silane coupling agent (refer to a paragraph 0028 in Patent Literature 1).

EXAMPLES

Hereinafter, the present disclosure will be described with reference to Examples. Note that, the present invention is not limited to the following Examples.

The following materials were prepared to prepare a layered plate including an ultra-thin copper foil layer on an outermost layer.

Micro-thin copper foil (manufactured by MITSUI MINING & SMELTING CO., LTD)
The thickness of an ultra-thin copper foil: 3 μm
The thickness of a carrier layer: 18 μm
A double-sided copper-clad laminate: MCL-E705G (manufactured by Showa Denko Materials Co., Ltd.)
The thickness of a copper layer: 12 μm
The thickness of a resin layer: 25 μm
The thickness of a copper layer: 12 μm
Four species of prepregs shown in Table 1 (manufactured by Showa Denko Materials Co., Ltd.)

TABLE 1

| Prepreg | | E-705G | E-770G | HS-200 | LW-910G |
|---|---|---|---|---|---|
| Thickness (μm) | | 25 | 25 | 25 | 25 |
| Components of thermosetting resin composition | Thermosetting resin (parts by mass) | 32 | 41 | 43 | 40 |
| | Heat-resistant resin (parts by mass) | 65 | 62 | 64 | 60 |
| | Silica filler (% by mass) | 53 | 55 | 62 | 65 |
| Presence or absence of glass cloth | | Presence | Presence | Absence | Presence |
| Water absorption rate (%) | | 0.4 | 0.3 | 0.3 | 0.2 |
| Relative dielectric constant @ 10 GHz | | 4.4 | 4.3 | 3.7 | 3.2 |
| Dielectric loss tangent @ 10 GHz | | 0.007 | 0.004 | 0.0045 | 0.002 |

In the table, the amount (% by mass) of the silica filler is a value based on the total mass of a resin contained in the thermosetting resin composition.

The amount of the silica filler described in Table 1 is the amount (parts by volume) when a total volume of solid contents contained in the thermosetting resin composition is set to 100 parts by volume. The water absorption rate described in Table 1 is a value calculated from the mass before and after the prepreg is left in an environment of 130° C. in temperature and 85% in relative humidity for 200 hours (before and after HAST). Note that, before performing HAST, the prepreg was left in an environment of 130° C. in temperature and 85% in relative humidity for 500 hours.

Water Absorption rate (%)=100×[(mass after HAST)−(mass before HAST)]/(mass before HAST)

The "relative dielectric constant" and the "dielectric loss tangent" described in Table 1 are values measured by using a network analyzer (manufactured by Keysight Technologies).

Example 1

One sheet of prepreg E-705G was superimposed on a surface of the double-sided copper-clad laminate (MCL-E705G). Next, the prepreg and the micro-thin copper foil were stuck to each other so that a surface of the prepreg and a surface of the ultra-thin copper foil come into contact with each other. Pressing was performed in a state in which the layered plate obtained in this manner is sandwiched between mirror plates. As pressing conditions, a temperature was set to 200° C., a pressure was set to 3.0 MPa, and time was set to 70 minutes. Then, only the carrier layer of the micro-thin copper foil was peeled off to obtain the layered plate according to Example 1 in which the ultra-thin copper foil (thickness: 3 μm) is provided on the outermost layer.

Examples 2 to 4

Layered plates according to Examples 2 to 4 were respectively prepared in a similar manner as in Example 1 except that E-770G, HS-200, or LW-910G was used as the prepreg instead of E-705G.

Example 5

A surface of the ultra-thin copper foil that is the micro-thin copper foil was treated with an organic acid-based micro etching agent (CZ-8401, manufactured by MEC Co., Ltd.). Treatment conditions were as follows.
Temperature: 25° C.
Time: 30 seconds On the other hand, one sheet of prepreg E-705G was superimposed on the surface of the double-sided copper-clad laminate (MCL-E705G). Next, the prepreg and the micro-thin copper foil were sticked to each other so that a surface of the prepreg and a surface to be treated of the ultra-thin copper foil come into contact with each other. Pressing was performed in a state in which the layered plate obtained in this manner is sandwiched between mirror plates. As pressing conditions, a temperature was set to 200° C., a pressure was set to 3.0 MPa, and time was set to 70 minutes. Then, only the carrier layer of the micro-thin copper foil was peeled off to obtain the layered plate according to Example 5 in which the ultra-thin copper foil (thickness: 3 μm) is provided on the outermost layer.

Examples 6 to 8

Layered plates according to Examples 6 to 8 were respectively prepared in a similar manner as in Examples 2 to 4 except that a treatment with an organic acid-based micro etching agent (CZ-8401 obtained by MEC Co., Ltd.) was performed on the surface of the ultra-thin copper foil that is the micro-thin copper foil as in Example 4.

An adhesion evaluation was performed on the layered plates according to the examples as follows. That is, the peel strength of an interface between the ultra-thin copper foil and the prepreg was measured under conditions of a peel width of 10 mm, a peel angle of 90°, and a peel speed of 10 mm/minute by using a desk peel tester (EZ-FX, manufactured by SHIMADZU CORPORATION). The adhesion was evaluated with respect to the following layered plates before and after a water absorption heating treatment. Results are shown in Tables 2 and 3.

(Water Absorption Heating Treatment)

Each of the layered plates was put into a highly accelerated life tester (EHS-222MD, manufactured by ESPEC CORP.), and a treatment was performed at a temperature of 130° C. and a relative humidity of 85% for 100 hours. A variation rate of the adhesion before and after HAST was calculated by the following Expression.

Variation rate (%) of 90° peel strength=100×[(peel strength after HAST)−(peel strength before HAST)]/(peel strength before HAST)

TABLE 2

| | | Example 1 | Example 2 | Example 3 | Example 4 |
|---|---|---|---|---|---|
| Ultra-thin copper foil | Thickness (μm) | 3 | 3 | 3 | 3 |
| | Presence or absence of surface treatment | Not-performed | Not-performed | Not-performed | Not-performed |
| Prepreg | Kind | E-705G | E-770G | HS-200 | LW-910G |
| | Water absorption rate (%) | 0.4 | 0.3 | 0.3 | 0.2 |
| 90° peel strength (N/mm) | Before HAST | 0.42 | 0.40 | 0.50 | 0.40 |
| | After HAST | 0.31 | 0.30 | 0.34 | 0.20 |
| Variation rate of 90° peel strength (%) | | −26.2 | −25.0 | −32.0 | −50.0 |

TABLE 3

| | | Example 5 | Example 6 | Example 7 | Example 8 |
|---|---|---|---|---|---|
| Ultra-thin copper foil | Thickness (μm) | 3 | 3 | 3 | 3 |
| | Presence or absence of surface treatment | Performed | Performed | Performed | Performed |
| Prepreg | Kind | E-705G | E-770G | HS-200 | LW-910G |
| | Water absorption rate (%) | 0.4 | 0.3 | 0.3 | 0.2 |
| 90° peel strength (N/mm) | Before HAST | 0.55 | 0.6 | 0.52 | 0.50 |
| | After HAST | 0.49 | 0.54 | 0.51 | 0.49 |
| Variation rate (%) | | −10.9 | −10.0 | −1.9 | −2.0 |

INDUSTRIAL APPLICABILITY

According to the present disclosure, there are provided a layered plate that is useful for manufacturing a circuit board with excellent reliability, and a method of manufacturing a circuit board using the layered plate.

REFERENCE SIGNS LIST

1: copper layer, 1a: remaining portion of copper layer, 2: rust preventive layer, 3, 12: resin layer, 5, 10, 15: layered plate, 7: support substrate, 7a: copper layer, 8: seed layer, 8a: remaining portion of seed layer, 9a, 9b: conductive portion, 11: resist pattern, 20: circuit board, G: groove, H1: opening (first opening), H2: opening (second opening), H3: opening.

The invention claimed is:

1. A layered plate comprising:
    a copper layer having a thickness of 5 μm or less; and
    a resin layer provided on a surface of the copper layer,
    wherein a water absorption rate of the resin layer is 1% or less after being left in an environment of 130° C. in temperature and 85% in relative humidity for 200 hours.

2. The layered plate according to claim 1, wherein 90° peel strength of an interface between the copper layer and the resin layer is 0.4 N/mm or more.

3. The layered plate according to claim 1, wherein 90° peel strength of an interface between the copper layer and the resin layer is 0.25 N/mm or more after being left in an environment of 130° C. in temperature and 85% in relative humidity for 200 hours.

4. The layered plate according to claim 1, wherein a variation rate of 90° peel strength is-30% to 0% before and after a highly accelerated life test performed in a state in which a sample of the layered plate is left in an environment of 130° C. in temperature and 85% in relative humidity for 200 hours.

5. The layered plate according to claim 1, further comprising a rust preventive layer between the resin layer and the copper layer.

6. The layered plate according to claim 1, wherein a relative dielectric constant of the resin layer is 4.5 or less at 10 GHz.

7. The layered plate according to claim 1, wherein a dielectric loss tangent of the resin layer is 0.05 or less at 10 GHz.

8. The layered plate according to claim 1, wherein the resin layer contains a thermosetting resin composition.

9. The layered plate according to claim 8, wherein the resin layer contains a glass cloth impregnated with the thermosetting resin composition.

10. The layered plate according to claim 8,
wherein the thermosetting resin composition contains silica filler, and a content of the silica filler is 65% by mass or less based on a total mass of the resin contained in the thermosetting resin composition.

11. A method of manufacturing a circuit board, the method comprising:
preparing a layered plate which includes a copper layer having a thickness of 5 μm or less, a resin layer, and a support substrate in this order, and in which a water absorption rate of the resin layer is 1% or less after being left in an environment of 130° C. in temperature and 85% in relative humidity for 200 hours;
forming a seed layer on a surface of the copper layer by electroless copper plating;
forming a resist pattern including a groove reaching a surface of the seed layer on the surface of the seed layer; and
filling the groove with a conductive material containing copper by electrolysis copper plating.

12. A method of manufacturing a circuit board, the method comprising:
preparing a layered plate which includes a copper layer having a thickness of 5 μm or less, a resin layer, and a support substrate in this order, and in which a water absorption rate of the resin layer is 1% or less after being left in an environment of 130° C. in temperature and 85% in relative humidity for 200 hours;
forming a first opening reaching a surface of the support substrate through the copper layer and the resin layer;
forming a seed layer on a surface of the copper layer and a side surface of the first opening by electroless copper plating;
forming a resist pattern including a second opening communicating with the first opening on a surface of the seed layer; and
filling the first opening and the second opening with a conductive material containing copper by electrolysis copper plating.

* * * * *